United States Patent [19]
Hinds et al.

[11] Patent Number: 5,949,266
[45] Date of Patent: Sep. 7, 1999

[54] ENHANCED FLIP-FLOP FOR DYNAMIC CIRCUITS

[75] Inventors: Chris N. Hinds, Austin; Mark Silla, Round Rock, both of Tex.

[73] Assignee: Advanced Micro Devices, Inc., Sunnyvale, Calif.

[21] Appl. No.: 08/959,228

[22] Filed: Oct. 28, 1997

[51] Int. Cl.$^6$ .................................................. H03K 3/037
[52] U.S. Cl. ..................... 327/208; 327/210; 327/211; 327/218
[58] Field of Search ................................. 327/200–203, 327/208–212, 214, 215, 217, 218

[56] References Cited

U.S. PATENT DOCUMENTS 5,497,115  3/1996  Millar et al. .............................. 327/211

FOREIGN PATENT DOCUMENTS

| | | | |
|---|---|---|---|
| 147597 | 7/1985 | European Pat. Off. ................ | 327/217 |
| 637132 | 2/1995 | European Pat. Off. ................ | 327/215 |
| 2-190018 | 7/1990 | Japan ..................................... | 327/212 |
| 5-327422 | 12/1993 | Japan ..................................... | 327/218 |

*Primary Examiner*—Tuan T. Lam
*Attorney, Agent, or Firm*—Conley, Rose & Tayon, PC; B. Noel Kivlin

[57] ABSTRACT

A flip-flop with enhanced support for dynamic circuits. The flip-flop comprises at least one data input node along with at least one inverting and at least one non-inverting output node. A clock input node receives an external clock signal and transmits it to a clocking unit which, in turn, generates a clock signal therefrom for gating an input signal received at the data input node. A storage unit holds the input signal value upon assertion of the clock signal and simultaneously transmits that value in appropriate logic level to inverting and non-inverting outputs. It is understood that the inverting and non-inverting outputs represent complementary signal values as is normally known in the art. The flip-flop further comprises a clear input node which is coupled to an edge-sensitive quiescent state control unit. A predetermined logic state transition, i.e. high to low or low to high, of a control signal applied to the clear input node triggers the edge-sensitive quiescent state control unit which, in turn, drives the inverting and non-inverting nodes to an identical logic level, i.e. either quiescent high or quiescent low depending on the design considerations. A non-inverted output signal and/or an inverted output signal at the inverting and non-inverting nodes, respectively, may be used to control the discharge of a node in a dynamic circuit. Since each of the output signals is cleared to a quiescent state after the signal is applied as an input to the dynamic circuit, the output of the flip-flop will not erroneously cause discharge of the node of the dynamic circuit when the next edge of the clock signal occurs.

17 Claims, 6 Drawing Sheets

ENHANCED FLIP-FLOP FOR DYNAMIC CIRCUITS

BACKGROUND OF THE INVENTION

1. Field of the Invention

This invention generally relates to digital flip-flop circuits, and more particularly to a binary flip-flop with enhanced support for dynamic circuit operations.

2. Description of the Related Art

In dynamic logic circuits, generally two phases are used in order to establish the correct signal at a logic node. During the first phase, the logic node is generally precharged to a high voltage and during the second phase the node is selectively discharged by providing an input signal to a discharge control node. The input signal can normally not be applied to the discharge control node until after the precharge phase is complete. Furthermore, if the input signal is unstable and changes its state after being applied to the discharge control node, that change of state can cause incorrect operation of the circuit. Thus, to provide proper timing control for the dynamic node, it becomes necessary to block the input signal from the discharge control node until the signal has resolved to a quiescent state so as to enable a sampling circuit to obtain the correct signal values.

Digital flip-flops are extensively used as building blocks in various logic designs. The foregoing discussion applies equally to the outputs of flip-flops when those outputs are also used as inputs in dynamic circuit operations. Thus, signals originating from a flip-flop, a timing signal is often required to block those signals until the flip-flop has stabilized its outputs to a predetermined quiescent state and after precharge is complete. FIG. 1 is a representative circuit depicting an arrangement to qualify the outputs of a flip-flop through use of an external ENABLE signal before those outputs are applied as inputs to a dynamic logic function.

In the depicted circuit, the ENABLE signal blocks the flip-flop outputs Q and QX during a possibly unstable period when a transition in the clock signal occurs. The Q output is shown applied as an input to a NAND gate 12 and its complement QX is shown applied to another NAND gate 14. The ENABLE signal is shown applied as an input to both NAND gates, 12 and 14, simultaneously. An associated signal flow diagram is shown in FIG. 2. In the timing diagram of FIG. 2, the outputs Q and QX are shown changing their states from low to high and high to low respectively after the rising edge of the clock signal applied to the CLK input node of the data flip-flop 10. Until the ENABLE signal is asserted, both outputs Q_ENA and QX_ENA in FIG. 1 are forced low. Only after the Q and QX outputs of the flip-flop have resolved to their quiescent state does the ENABLE input gate Q and QX to Q_ENA and QX_ENA respectively. These gated outputs Q_ENA and QX_ENA, in turn, can be applied as inputs to a subsequent dynamic logic function.

An example of a circuit requiring this gating through an external ENABLE signal would be a dynamic NOR gate used in zero detection. FIG. 3 shows an N-bit zero detection circuit built with conventional flip-flops generally represented by numeral 10 in FIGS. 1 and 3. Other elements constituting this circuit include a pair of delay inverters 20, an N number of AND gates 22—one for each flip-flop output bit, a corresponding N number of pull-down transistors 26 and a precharge transistor 24. In normal operation of this circuit, the ALL_ZERO output line would be high when each flip-flop output bit, BIT_0 through BIT_N, is "zero" or low. If any one of the output bits, i.e. BIT_0 through BIT_N, changes its state from high to low and if this state change is allowed to propagate to the corresponding pull-down transistor 26 (i.e., if no enable signal were provided), then the prior high value may turn on the corresponding transistor 26 and, thus, may erroneously discharge the precharged D_NODE line.

This error results because of the allowance of a state of one of the flip-flops 10 before the Q outputs have resolved to their quiescent states, i.e. low in this case. The gates of the N-channel pull-downs 26 are thus qualified to delay the Q outputs until the outputs have resolved to the state of the flip-flops. The ENABLE signal in FIG. 3 is a delayed version of the CLK or the external clock signal. The delay introduced by the representative pair of inverters 20 must be sufficient to guarantee stability of the Q outputs. Thus, for this circuit, the ENABLE signal must assert after all Q outputs of the flip-flops 10 have stabilized. This necessarily requires that the delay must be greater than the worst flip-flop CLK to Q output delay and must also incorporate some additional delay for safety. This delay is also increased by the AND gates 22 used to gate the inputs for the pull-down devices 26.

In addition to the above design considerations, the generation itself of the gating ENABLE signal mandates an additional delay. Because of the decoupling of the flip-flops and the generation of the ENABLE signal, it may be difficult to properly time the assertion of the ENABLE signal. To insure that the ENABLE signal follows all flip-flop outputs, an additional delay must be introduced which is greater than the anticipated worst case flip-flop output delay.

It is thus desirable to have a flip-flop that could be used in a dynamic logic function without generation of an external ENABLE signal and also without the need for the external AND gating logic or delay inverters and buffers.

SUMMARY OF THE INVENTION

The problems outlined above are in large part solved by a flip-flop designed in accordance with the present invention. An efficient flip-flop design that alleviates the need for the external AND gating or external ENABLE signal generation is disclosed.

In one embodiment, a flip flop circuit incorporates circuitry for clearing the outputs to a known level—either voltage high or voltage low, depending on the design considerations—after the internal state of the master section of the flip-flop has resolved to the output drivers. This results in an improved delay timing over conventional designs which were earlier discussed with reference to FIGS. 1 and 3.

The present invention contemplates a flip-flop with enhanced support for dynamic circuits. The flip-flop comprises at least one data input node along with at least one inverting and at least one non-inverting output node. A clock input node receives an external clock signal and transmits it to a clocking unit which, in turn, generates a clock signal therefrom for gating an input signal received at the data input node. A storage unit holds the input signal value upon assertion of the clock signal and simultaneously transmits that value in appropriate logic level to inverting and non-inverting outputs. It is understood that the inverting and non-inverting outputs represent complementary signal values as is normally known in the art. The flip-flop further comprises a clear input node which is coupled to an edge-sensitive quiescent state control unit. A predetermined logic state transition, i.e. high to low or low to high, of a control signal applied to the clear input node triggers the edge-sensitive quiescent state control unit which, in turn, drives the inverting and non-inverting nodes to an identical logic level, i.e. either quiescent high or quiescent low depending on the design considerations. A non-inverted output signal and/or an inverted output signal at the inverting and non-inverting nodes, respectively, may be used to control the discharge of a node in a dynamic circuit. Since each of the output signals is cleared to a quiescent state after the signal is applied as an input to the dynamic circuit, the output of the flip-flop will not erroneously cause discharge of the node of the dynamic circuit when the next edge of the clock signal occurs. Advantageously, no external enable signal and associated gating logic is required.

Furthermore, the present invention also contemplates a mechanism to generate a control signal appearing at the clear input node of the flip-flop. A dummy flip-flop is provided to operate in a feedback manner to generate that control signal in synchronism with the external clock. The flip-flop outputs are controlled to automatically enter into their predetermined quiescent states prior to every precharge phase. This entails improved performance of the flip-flop when used in dynamic circuits and further results in delay time savings because of an absence of an elaborate delay mechanism. Additionally, a simplified dynamic circuit design can be achieved when the flip-flop of the present invention is employed.

BRIEF DESCRIPTION OF THE DRAWINGS

Other objects and advantages of the invention will become apparent upon reading the following detailed description and upon reference to the accompanying drawings in which.

Figure 1:
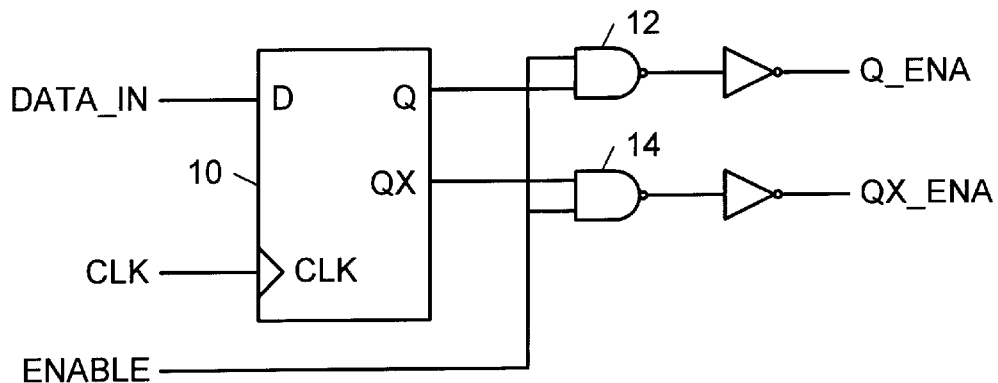
FIG. 1 shows a conventional arrangement to qualify the outputs of a flip-flop through an external ENABLE signal before they are applied as inputs to a dynamic logic function.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENT

Figure 4:
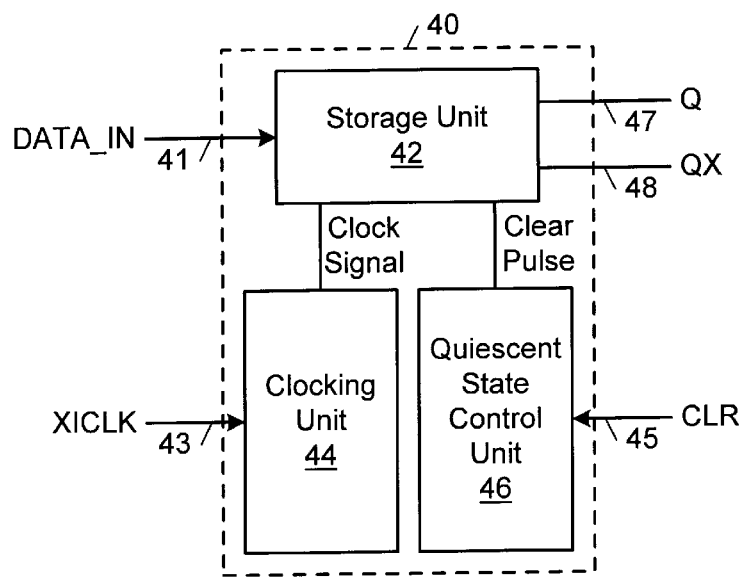
FIG. 4 is a block diagram of a flip-flop in accordance with an embodiment of the present invention.

Referring now to FIG. 4, a flip-flop 40 is shown including three interrelated circuit elements: a storage unit 42, a clocking unit 44, and a quiescent state control unit 46. Storage unit 42 is shown coupled to a data input node 41, a clocking unit 44 and a quiescent state control unit 46. Although only one data input node has been shown, more than one data input node may be incorporated as part of the flip-flop 40. The storage unit 42 transmits the received input signal at the input node 41 to a set of complementary output nodes. A non-inverting output node 47 conveys the same value of the input signal as it appears at the input node 41 when an external clock is asserted at the clock input node 43. On the other hand, as is known in the art, an inverting output node 48 conveys the complement of the input signal value when the external clock is asserted.

It is noted that, as used herein, a signal is "asserted" if it conveys a value indicative of a particular condition. Conversely, a signal is "deasserted" if it conveys a value indicative of a lack of a particular condition. A signal may be defined to be asserted when it conveys a logical zero value or, conversely, when it conveys a logical one value.

Referring again to FIG. 4, the clocking unit 44 is coupled to an external clock input node 43 (XICLK) and is configured to generate a clock signal from the external clock supplied to the clock input node 43. This clock signal is used to gate the input signal from node 41 as described in greater detail below. The quiescent state control unit 46 generates a clear pulse from a predetermined edge transition of a CLR signal received at the clear input node 45 of the flip-flop 40. Thus, in the flip-flop of FIG. 4, when the clock signal is asserted, the storage unit holds the logic state of the input signal at the data input node 41. The storage unit 42 also simultaneously transmits the appropriate logic state of that input signal to the inverting and non-inverting output nodes respectively. That is, the complement of the logic state of the input signal would appear at the inverting output node.

After the storage unit transmits the data signal to the output nodes 47 and 48 in response to the clock signal, and before the dynamic circuit enters into its precharge phase, a control signal is applied to the CLR input 45 node to drive the flip-flop outputs into a predetermined quiescent state. In one embodiment, the quiescent state control unit is edge-triggered. Therefore, upon a predetermined edge transition of the control signal at node 45, the quiescent state control unit generates a clear pulse which forces both the output nodes to an identical quiescent state. Thus, the flip-flop outputs achieve the quiescent state before a precharge signal is applied in the circuit employing the flip-flop 40.

Figure 3:
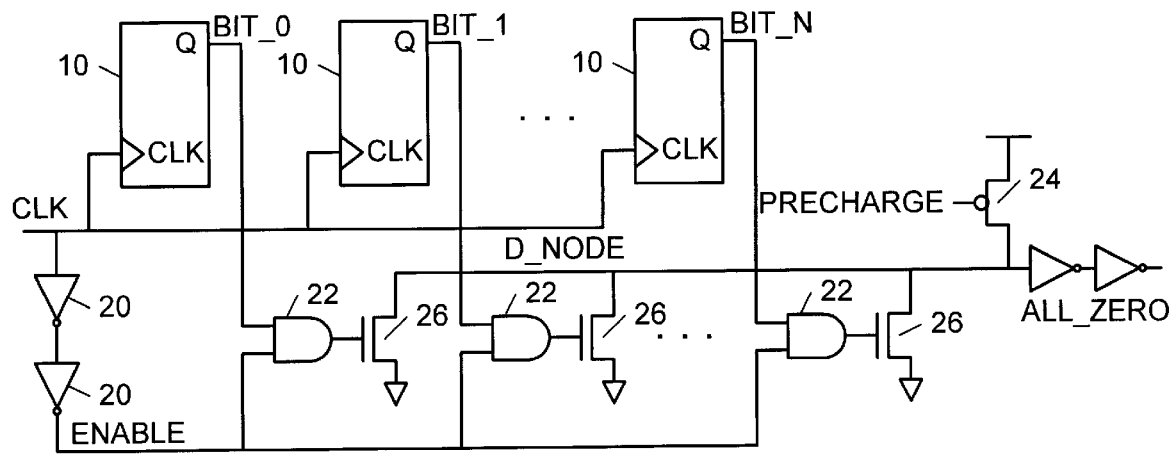
FIG. 3 shows a dynamic NOR gate using conventional flip-flops and external delay elements.
Figure 5:
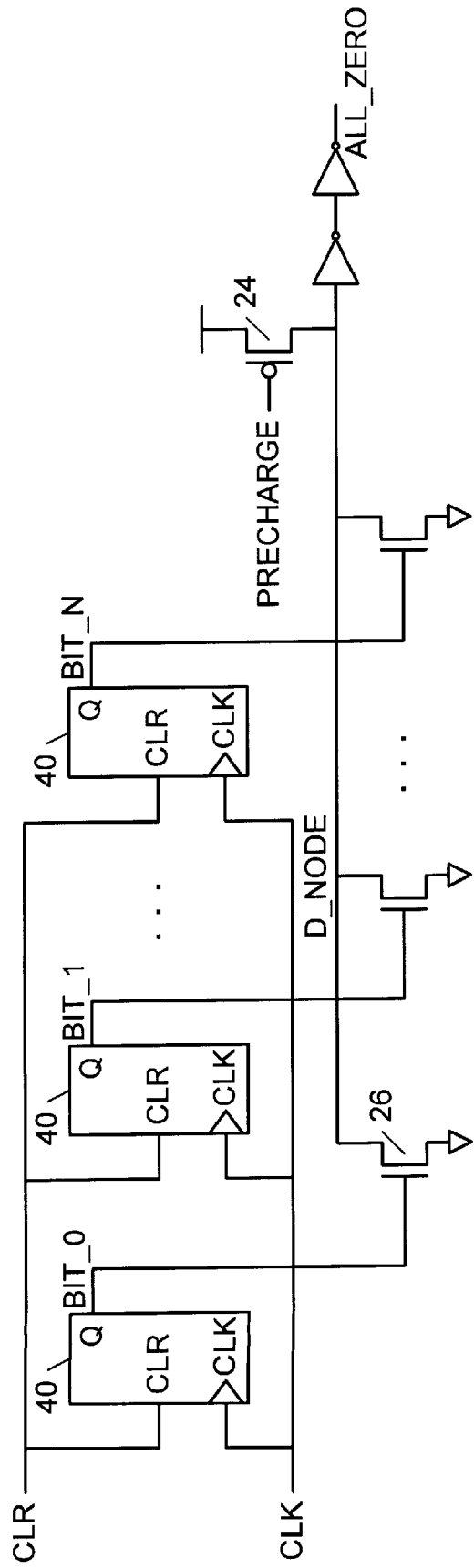
FIG. 5 shows the dynamic NOR gate of FIG. 3, but using flip-flops according to an embodiment of the present invention, and without any external delay network.

To further illustrate the simplicity in design achieved when a dynamic circuit is built using the flip-flop 40 of the present invention, the reader is referred to FIG. 5 which shows the dynamic NOR gate of FIG. 3 built with the flip-flops 40 and without any external delay elements. Here, as in FIG. 3, a zero detecting circuit is achieved, but without any AND gating or external ENABLE signal generation. Integration of the enable control within the flip-flop removes routing of the external ENABLE signal and its associated buffering by substituting a larger flip-flop design. The delay added by the gating logic is also removed. A speedup of about 100 ps per clock cycle for this flip-flop 40 over a similarly designed (as to driver size, inputs and functions) conventional flip-flop 10 (with external delay elements) may be achieved for quiescent high output level.

Figure 6:
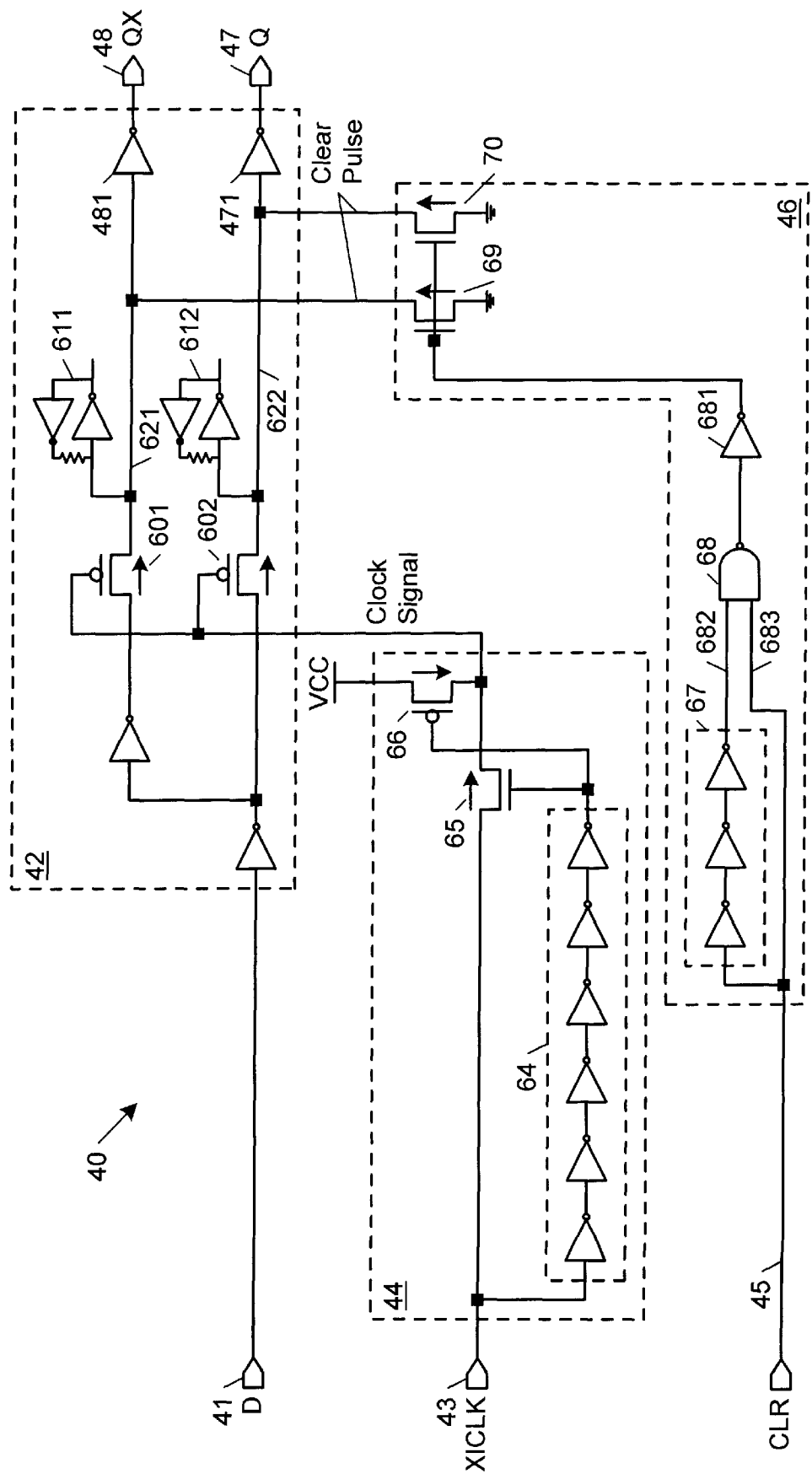
FIG. 6 is a detailed circuit layout of a quiescent high version of a flip-flop constructed according to an embodiment of the present invention.

Referring now to FIG. 6, a detailed circuit diagram for a quiescent high output version of the flip-flop 40 is shown. The storage unit 42, the clocking unit 44 and the quiescent state control unit 46 are also shown with their detailed circuits. The storage unit 42 comprises a pair of p-channel output transistors, 601 and 602, with their sources coupled to the data input node 41. This pair of output transistors may be fabricated into a single output transistor depending upon the design requirements. These p-channel transistors turn on when their gates are negative with respect to their sources. Thus, a negative-going clock signal turns on these transistors and the data signal at node 41 is transmitted to the outputs, 47 and 48, through a pair of storage nodes, 621 and 622. Here, the term "negative" refers to the lower voltage level state in a binary connotation.

A keeper circuit 611 associated with the inverting output node 48 maintains a logic state at its storage node 621. This logic state is complementary of the input signal's logic state appearing at the storage node 622 through another keeper circuit 612 associated with the non-inverting output node 47. A keeper circuit may be constructed with a pair of inverters connected back to back with one inverter having a higher internal resistance than the other one.

The clock signal necessary to gate the input signal at node 41 to the flip-flop outputs 47 and 48 may be generated by the clocking unit 44. The flip-flop receives an external clock signal from another circuit element, e.g. a microprocessor or a clock signal generator, at its XICLK input node 43. Depending upon the system timing requirements, the external clock or XICLK signal may be delayed by a bank of inverting gates constituting a delay network 64. The delay network may incorporate an even number of inverting gates as shown in FIG. 6. The delayed XICLK signal is applied to the gate of a gating transistor 65, while the original non-delayed XICLK signal is fed to the source of the gating transistor 65. As the gating transistor is an n-channel device, it makes the flip-flop 40 negative-edge triggered on XICLK.

As the gating transistor is turned on, it generates the clock signal in the form of a negative pulse. But, this clock signal swiftly changes its negative state when the gate of the transistor 65 becomes less positive with respect to its source. This occurs precisely when the negative edge of XICLK first appears at the gate of the transistor 65. Thus, the delay provided by the delay network 64 determines the negative pulse width of the clock signal, i.e. the duration for which the clock signal stays negative. This may be called an active pulse width of the clock signal because it is during this time period that the transistors 601 and 602 are turned on, thereby gating the input signal to the output nodes Q and QX.

The output transistors 601 and 602 can be called the master nodes of the flip-flop 40. When these transistors are off, the prior logic state at the storage nodes 621 and 622 is maintained by the corresponding keeper circuits, 611 and 612 respectively. This prior logic state may include the previous input signal value or the predetermined quiescent state level. When the master nodes are turned on, the present input signal level appears at the storage nodes and is maintained there by the keeper circuits until a control signal is asserted at the CLR input node 45. This control signal then drives both the outputs Q and QX into a predetermined quiescent state, i.e. quiescent high state in this particular circuit design. This quiescent state is then also maintained through the keeper circuits until the next input signal is gated through the clock signal by turning on the output transistors 601 and 602.

The clocking unit 44 also includes a data transfer control transistor 66 with its drain coupled to the drain terminal of the gating transistor 65, its gate coupled to the gate of the gating transistor 65, and its source tied to a high voltage level as shown in FIG. 6. This data transfer control transistor receives the delayed XICLK signal as an input to its gate terminal. Thus, when the gating transistor 65 stops conducting because of the negative XICLK signal at its gate, the data transfer control transistor 66 turns on at precisely that moment. This allows a sharp cutoff of the master nodes 601 and 602 when the gating transistor 65 is also being turned off. The data transfer control transistor 66 remains in conduction until its gate is no longer less positive than its source. This normally occurs when the positive logic state of XICLK signal reaches the gate of the transistor 66. This sequence is repeated on each XICLK cycle.

Another unit in the flip-flop 40 is the edge-triggered quiescent state control unit 46 (FIG. 4), an embodiment of which is shown in circuit-level detail in FIG. 6. As the name implies, the quiescent state control unit sets both the outputs, Q and QX to a predetermined identical logic level or quiescent state upon receipt of a control signal at the clear input node 45. The predetermined identical logic state for the circuit in FIG. 6 is quiescent high. The quiescent state control unit is edge sensitive, i.e. it generates the required clear pulse when triggered by a specific edge of the control signal. In the circuit of FIG. 6, a positive-going edge of the control signal generates a negative clear pulse as discussed further below.

The quiescent state control unit 46 comprises a delay network 67, a control gate 68 and a pair of quiescent state control transistors 69 and 70. The pair of quiescent state control transistors may be fabricated into one single transistor depending upon the application and design requirements. A control signal appearing at the clear or CLR input node 45 is fed as an input to the control gate 68 and also as an input to the delay network 67. The delay network may incorporate an odd number of inverters as specifically shown in the embodiment of FIG. 6. The control gate 68 may be a NAND gate followed by an inverter 681 as in FIG. 6 or may be a NAND gate without an inverter as in FIG. 7. The choice of quiescent state control transistors, 69 and 70, determines the appropriate NAND gate configuration as can be clearly seen in FIGS. 6 and 7.

Every time a control signal at the CLR input node 45 changes its state from low to high, it generates a negative-going clear pulse as described herein. Control signal's state transition from low to high generates a positive-going edge at the input terminal 683 of the NAND gate 68. But, because of the delay network 67, the input 682 of the NAND gate 68 would still be high from the previous low state of the control signal. This is because of the odd number of inverters in the delay network 67. Thus, until the high state of the control signal reaches the input 682 as a low state because of the inverters, the NAND gate 68 has both its inputs as high. This results in a negative or low voltage level at the control gate 68 output. The output of the NAND gate 68 returns to its high state when one of its input terminals return to a low state. Thus, as soon as the high state of the control signal is transmitted to the input terminal 682 as a low state (because of the odd number of inverters), the NAND gate 68 output returns to a high state and remains therein until the next positive going edge of the control signal. Because, when control signal returns to its low state, at that time input 683 would be in low state, thereby keeping the NAND gate output at its high level.

Thus, the negative pulse width of the NAND gate output—i.e. the duration during which that output remains low—is determined by the delay provided through the delay network. Thus, a designer can easily design appropriate delay for a particular embodiment. Similarly, it is also feasible to adjust the delay of the network 64 in connection with the delay introduced by the network 67 so as to properly time the clock signal and the clear pulse. This allows greater design flexibility over wider range of operating frequencies.

The NAND gate output is inverted by the inverter 681 (FIG. 6) and applied as a gate input to the pair of transistors 69 and 70. Thus, when the control signal at CLR node 45 transitions its state from low to high, it generates a negative pulse at the NAND gate 68 output and that, in turn, gets inverted by the inverter 681. Thus, the quiescent state control transistors receive a positive pulse every time the control signal changes from low to high state. That is, upon the rising edge of the control signal, the quiescent state control transistors, 69 and 70, turn on and generate a negative clear pulse because of their n-channel configuration. The drain terminals of these transistors are individually connected to respective outputs, Q and QX, through the driver inverters 471 and 481. Thus, as soon as the quiescent state control transistors conduct, their source voltage—low, here—gets applied to the inputs of the output inverters 471 and 481 in the form of a negative clear pulse. This results in both the output nodes, 47 and 48, being driven to the same high state.

The quiescent state control transistors, 69 and 70, stop conducting when their gates are no longer positive with respect to their source terminals. That is, when the NAND gate 68 output returns to its high level, it forces the transistors 69 and 70 to cut off because of the inverter 681. Thus, the duration of conduction of the transistors 69 and 70, and hence, the negative pulse width of the clear signal, are directly determined by the delay network 67. The time period during which the control signal stays negative can be called its operating pulse width, because it is during this time that the outputs, Q and QX, are both driven into their quiescent high state. The clear pulse drives the outputs, Q and QX, into an identical state by setting an identical voltage level at the corresponding storage nodes 622 and 621. Thus, the output nodes, 47 and 48, may continue to be in their quiescent high state even after the quiescent state control transistors (69 and 70) are turned off. The keeper circuits, 611 and 612, would maintain the quiescent high state until the next conduction of the output transistors, 601 and 602.

Figure 2:
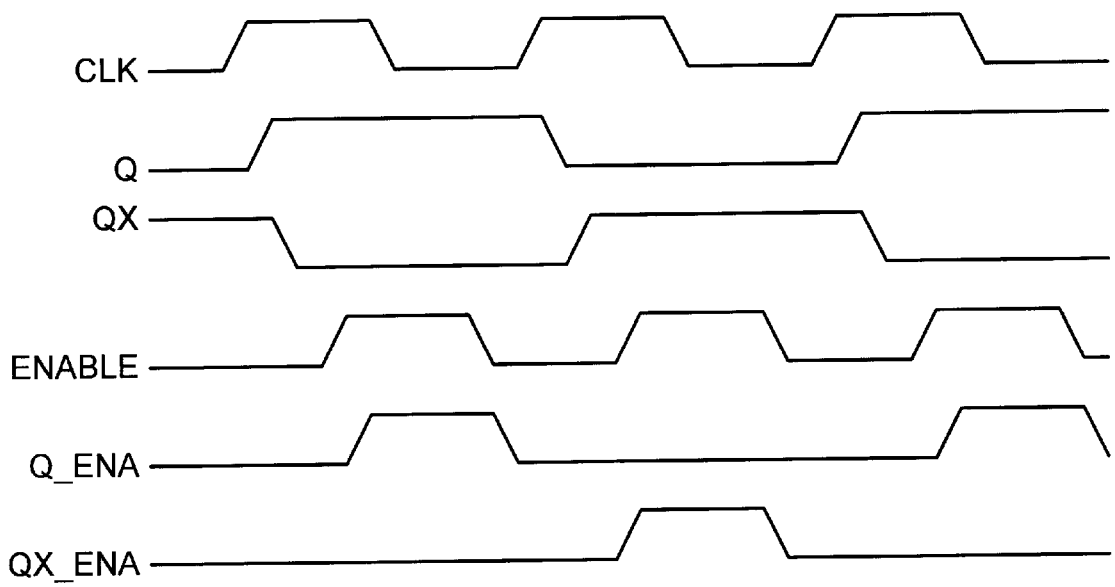
FIG. 2 is a timing diagram for the arrangement in FIG. 1.

Thus, in the circuit of FIG. 6, until a rising edge of a control signal is received at the CLR input node 45, the outputs Q and QX convey appropriate input data signal value appearing at the D input node 41. Proper timing of the control signal with respect to the XICLK signal can be easily achieved through determination of delays introduced by the delay networks internal to the flip-flop 40. Thus, the timing diagram of FIG. 2 can be easily accomplished without any need for external delay elements.

Figure 7:
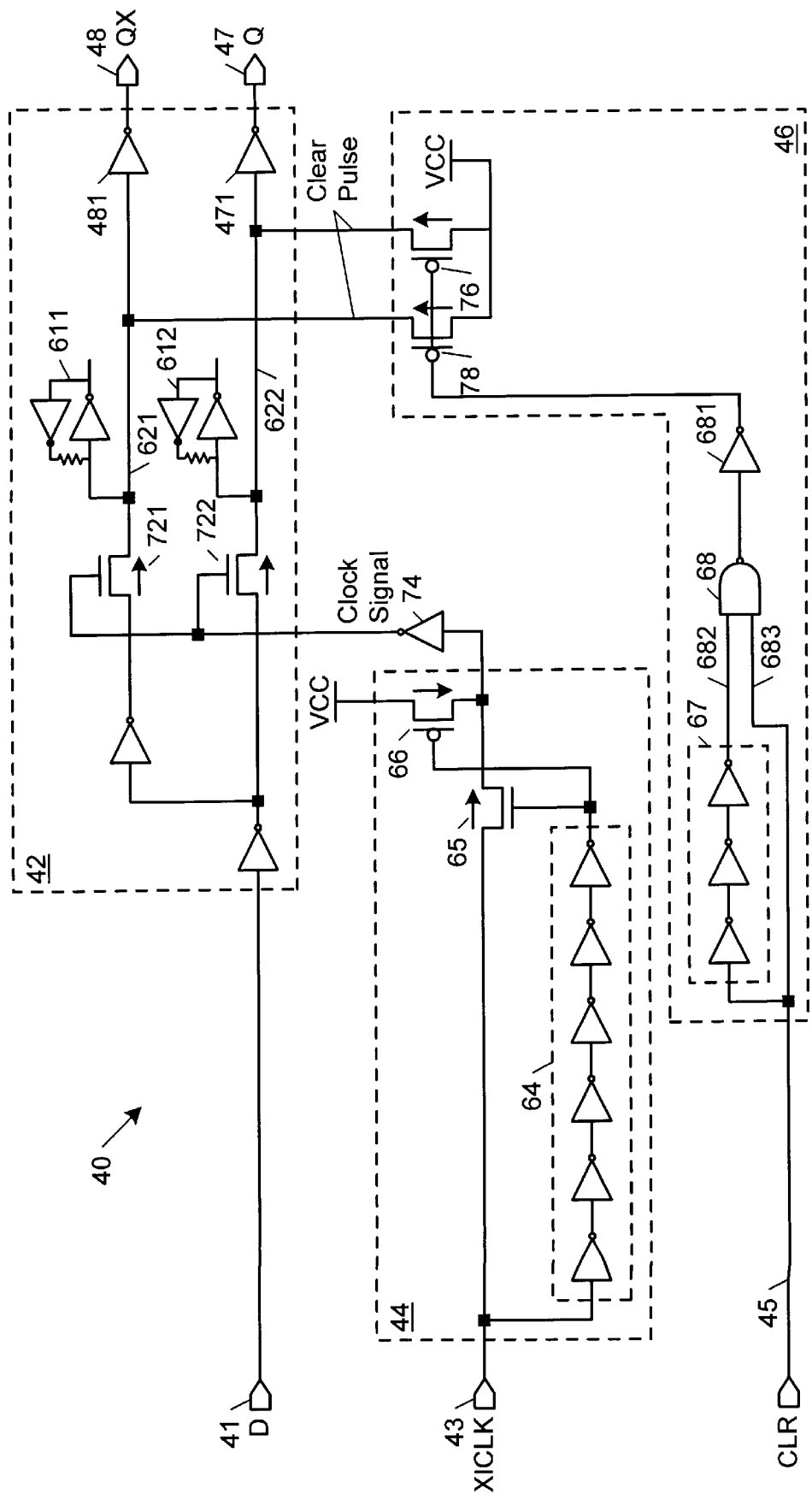
FIG. 7, likewise, is a detailed circuit layout of a quiescent low version of a flip-flop constructed according to an embodiment of the present invention.

FIG. 7 is similar to FIG. 6 and is a detailed circuit layout of quiescent low version of the flip-flop 40. The quiescent state control transistors in FIG. 7, elements 76 and 78, are p-channel instead of the corresponding n-channel transistors in FIG. 6. Thus, the inputs of the inverters 471 and 481 are driven high when these p-channel transistors are conducting. This results in the Q and QX outputs being quiescent low. Also, the clocking unit is modified to include an inverter 74 so as to be able to gate the input signal by turning on the n-channel output transistors 721 and 722. Except for these minor design differences, the circuits in FIGS. 6 and 7 operate in the same manner. Thus, the previous description with reference to FIG. 6 equally applies to the embodiment of FIG. 7. It is to be understood that FIGS. 6 and 7 are just illustrative examples of specific implementations of data flip-flops constructed for use in dynamic circuits. Many other circuit level implementations of the flip-flop are also possible.

As dynamic circuits depend on the ability to precharge a node and discharge the node under controlled timing, the flip-flop 40 has to be designed to meet or exceed the conventional timing requirements. Because of the built-in delay circuits, the flip-flop can be fabricated with exact delays between the clock signal and the output signal, and also between the clock signal and the control signal. This allows the flip-flop 40 outputs to return to their quiescent level before the precharge signal is applied in the actual dynamic circuit and after the clock signal has gated the input signal to the flip-flop outputs. Thus, the output nodes will consistently provide the sampling circuit a correct state of the flip-flop input signal irrespective of the internal signal state transitions. No external delay and timing adjustments are required. Timing measurements using SPICE have shown comparable delays between XICLK and Q and QX for the library flip-flop and the flip-flop 40 of the present invention. The uses of the flip-flop 40 of the present invention include all zero or all ones detection, dynamic reduction circuits, and most wide-gate requirements, among others.

Figure 8:
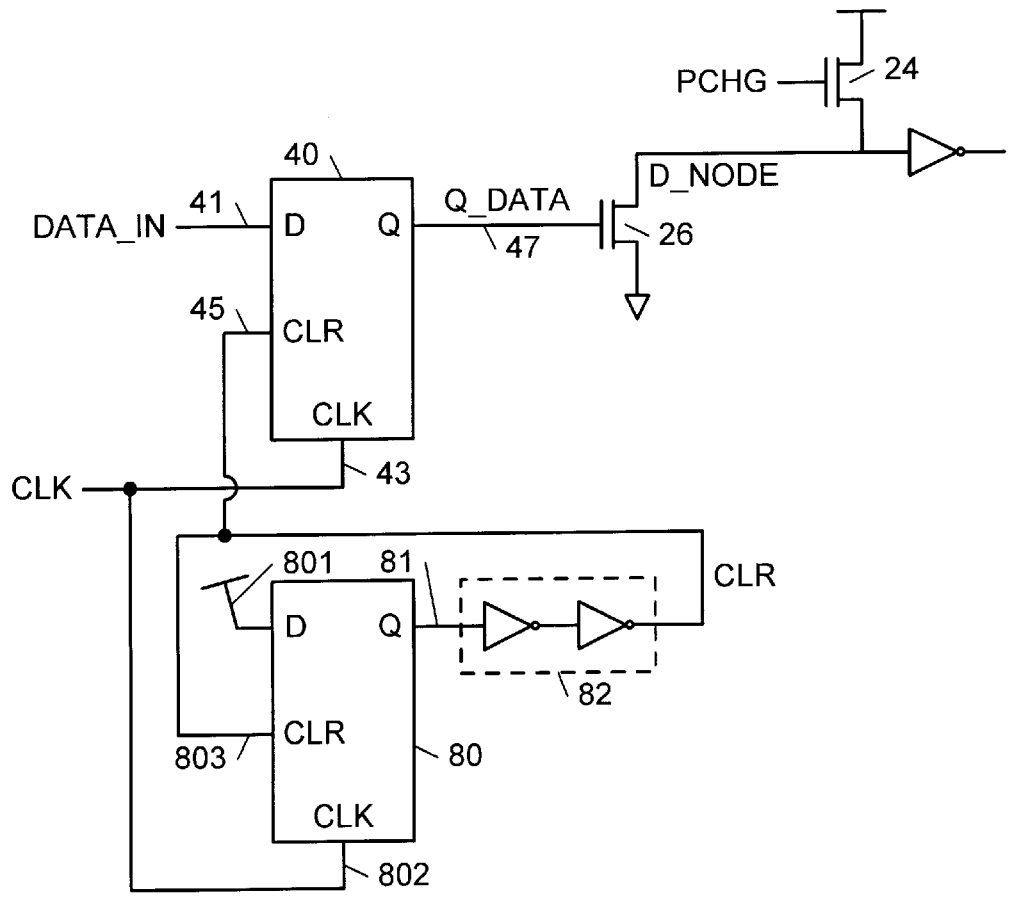
FIG. 8 shows a circuit arrangement to generate a clear signal.

Referring now to FIG. 8, a circuit arrangement to generate a CLR or control signal that can be applied to the CLR input node of the flip-flop 40 in FIG. 4 is shown. A dummy flip-flop 80 is shown coupled to the flip-flop 40 in a feedback manner. A dummy data input node 801 is permanently tied to a predetermined voltage level, i.e. high in this circuit. A dummy clock input node 802 is coupled to the XICLK node 43 of flip-flop 40 and receives an external clock signal thereon. A dummy output node 81 is coupled to the CLR input node 45 of the flip-flop 40 through a delay network 82. The delay network provides a predetermined delay between the assertion of the external clock signal at the XICLK node 43 and the assertion of the CLR or control signal at the CLR input node 45 of the flip-flop 40. With proper timing, the CLR signal can be made to arrive after the assertion of the external clock and before the assertion of the PCHG signal to the precharge node 24. Optimally, this delay is set to be slightly above the worst-case delay associated with the discharge of the D_NODE signal when transistor 26 is turned on due to a high assertion of the Q_DATA node. Thus, correct sampling of the Q_DATA signal on the node 47 can be accomplished during dynamic logic function execution.

As shown in FIG. 8, a dummy clear input node 803 is also coupled to the output of the delay network 82. This effectively forms a feedback path for the output signal from the dummy flip-flop 80. As the dummy flip-flop is a data flip-flop, it transfers the high voltage level appearing at its D input node 801 to its Q output 81 upon an assertion of the external clock at CLK node 802. This output signal Q_CLR at node 81 is delayed by the delay network 82 and applied to the CLR terminals of the flip-flop 40 and the dummy flip-flop 80. As soon as the CLR signal is applied at the CLR input node 45 of the flip-flop 40, both of its outputs are driven into their predetermined quiescent state. Similarly, the CLR signal also goes to the dummy clear input 803, and the dummy flip-flop resets its output. This drives the Q output at node 81 low. The CLR signal is therefore maintained low until the next assertion of the external clock signal and the transfer of the D input value at node 801 to the output 81.

Figure 9:
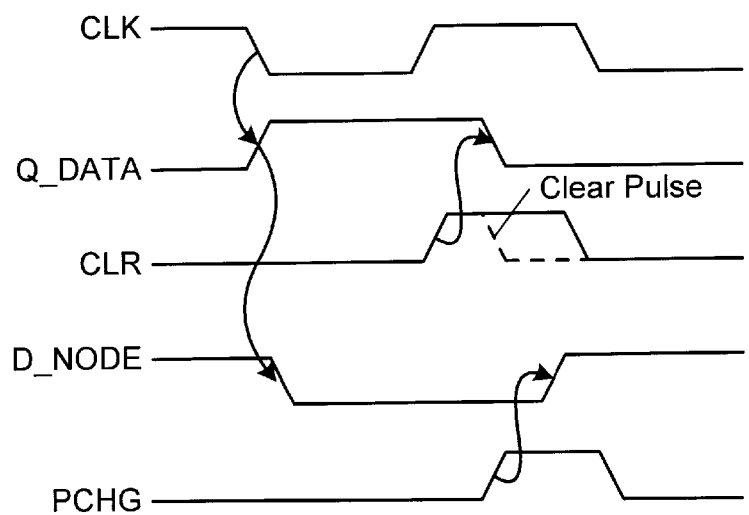
FIG. 9 is a representative timing diagram for the arrangement in FIG. 8.

A representative timing diagram for the circuit arrangement in FIG. 8 is shown in FIG. 9. Various edge transitions are also shown. The waveforms in FIG. 9 are for a quiescent low design as can be seen from the Q_DATA signal.

The CLR signal generation according to FIG. 8 may be varied in other embodiments. Further, instead of the dummy flip-flop 80 being a D-type flip-flop, many other flip-flop configurations may be conveniently employed. Also, the delay network 82 in FIG. 8 may be implemented in various manners and may include more than two inverting gates.

Numerous variations and modifications will become apparent to those skilled in the art once the above disclosure is fully appreciated. It is intended that the following claims be interpreted to embrace all such variations and modifications.

What is claimed is:

1. A flip-flop with enhanced support for dynamic circuits comprising:
   at least one data input node;
   at least one inverting output node;
   at least one non-inverting output node;
   a clock input node;
   a clear input node;
   a storage unit coupled to said at least one data input node, wherein said storage unit is configured to hold and transmit a logic state of an input signal at said at least one input node to said at least one inverting output node and said at least one non-inverting output node in response to a clock signal;
   a clocking unit coupled to said storage unit and to said clock input node, wherein said clocking unit is configured to process an external clock received from said clock input node to generate said clock signal therefrom;
   an edge-sensitive quiescent state control unit coupled to said storage unit and said clear input node, wherein said edge-sensitive quiescent state control unit is configured to drive said at least one inverting output node and said at least one non-inverting output node to an identical logic level during a logic state transition of a control signal at said clear input node;
   wherein said edge-sensitive quiescent state control unit processes said control signal received from said clear input node along with a delayed version of said control signal to trigger a clear pulse upon said logic state transition of said control signal, wherein said delayed version of said control signal is generated by said edge-sensitive quiescent state control unit by applying a first predetermined delay to said control signal, and wherein said first predetermined delay determines an operating pulse width of said clear pulse.

2. The flip-flop as in claim 1, wherein said storage unit comprises:
   a first keeper circuit coupled to a first storage node, wherein said first keeper circuit is configured to maintain a logic state at said first storage node, and wherein a state of said at least one non-inverting output node is dependent upon said logic state at said first storage node;
   a second keeper circuit coupled to a second storage node, wherein said second keeper circuit is configured to maintain a logic state at said second storage node, and wherein a state of said at least one inverting output node is dependent upon said logic state at said second storage node; and
   a switching circuit coupled between said at least one data input node and said first and second storage nodes, wherein said switching circuit is configured to selectively cause said logic state of said input signal at said at least one data input node to define said logic states maintained at said first storage node and said second storage node.

3. The flip-flop as in claim 1, wherein said clocking unit processes said external clock along with a delayed version of said external clock to generate said clock signal, wherein said delayed version of said external clock is generated by said clocking unit by applying a second predetermined delay to it, and wherein said second predetermined delay determines an active pulse width of said clock signal.

4. The flip-flop as in claim 3, wherein said storage unit is configured to latch said logic state of said input signal at said at least one input node only during said active pulse width of said clock signal and hold said logic state for transmission to said at least one inverting and non-inverting output nodes for a duration equal to the period of said clock signal.

5. The flip-flop as in claim 4, wherein said storage unit latches said logic state of said input signal during an edge of said clock signal.

6. The flip-flop according to claim 1, wherein said edge-sensitive quiescent state control unit is configured to maintain said identical logic level at said at least one inverting and non-inverting output nodes during said operating pulse width of said clear pulse.

7. The flip-flop as in claim 2, wherein said switching circuit includes a first transistor coupled to selectively convey a value indicative of said input signal to said first storage node.

8. The flip-flop as in claim 7, wherein said switching circuit further comprises a second transistor coupled to selectively convey a second value indicative of said input signal to said second storage node.

9. The flip-flop as in claim 2, wherein said switching circuit includes at least two transistors coupled between said at least one data input node and said first and second storage nodes.

10. A flip-flop for use with dynamic circuitry comprising:
    a data input node;
    a non-inverting output node;
    an inverting output node;
    a first keeper circuit coupled to a first storage node, wherein said first keeper circuit is configured to maintain a logic state at said first storage node, and wherein a state of said non-inverting output node is dependent upon said logic state at said first storage node;
    a second keeper circuit coupled to a second storage node, wherein said second keeper circuit is configured to maintain a logic state at said second storage node, and wherein a state of said inverting output node is dependent upon said logic state at said second storage node;
    at least one output transistor coupled between said data input node and said first storage node, wherein said at least one output transistor is configured to momentarily turn on in response to a clock signal whereby a state of an input signal at said data input node controls said logic state maintained at said first storage node;
    a quiescent state control unit coupled to said first storage node and to said second storage node, wherein said quiescent state control unit sets a logic level at said first storage node and a logic level at said second storage node such that said inverting output node is driven at the same logic level as said non-inverting output node in response to a control signal; and
    a clocking unit coupled to receive an external clock at a clock input node, wherein said clocking unit includes:
       a gating transistor configured to process said external clock to generate said clock signal therefrom, wherein a first terminal of said gating transistor is coupled to said clock input node to receive said external clock and a second terminal of said gating transistor receives a delayed version of said external clock, and wherein a third terminal of said gating transistor is coupled to said at least one output transistor to transmit said clock signal thereto; and a first delay network coupled between said clock input node and said second terminal of said gating transistor, wherein said first delay network receives said external clock and generates a delayed version thereof by applying a first predetermined delay to it, and wherein said first predetermined delay determines an active pulse width of said clock signal.

11. The flip-flop as in claim 10, wherein said first delay network comprises an even number of inverting gates.

12. The flip-flop as in claim 10, wherein said at least one output transistor is configured to turn on for a duration equal to said active pulse width of said clock signal.

13. The flip-flop as in claim 12, wherein said clocking unit further comprises:

a data transfer control transistor coupled between said at least one output transistor and said first delay network, wherein said data transfer control transistor receives said delayed version of said external clock as an input and immediately drives said at least one output transistor in its cut off state when said gating transistor is switched off, thereby allowing said first and second storage nodes to maintain their respective logic states.

14. The flip-flop as in claim 10, further comprising:

a clear input node to receive said control signal;

a dummy flip-flop to generate said control signal, wherein said dummy flip-flop comprising:

a dummy data input node permanently tied to a predetermined voltage level, a dummy clock input node, wherein said dummy clock input node is coupled to said clock input node to clock said dummy flip-flop by said external clock, a dummy output node coupled to said clear input node through a delay network, and a dummy clear input node coupled to said dummy output node through said delay network, thereby forming a feedback mechanism, wherein said external clock allows said predetermined voltage level to appear at said dummy output node in synchronism therewith, and wherein said dummy clear input flips said predetermined voltage level appearing at said dummy output when activated, thereby generating said control signal in synchronism with said external clock.

15. The flip-flop as in claim 10, further comprising a clear input node to receive said control signal and transmit it to said quiescent state control unit, wherein said quiescent state control unit comprises:

a control gate with a first input coupled to said clear input node to receive said control signal therefrom and a second input coupled to said clear input node through a second delay network applying a second predetermined delay to said control signal, wherein said control gate generates a clear pulse at its output upon a predetermined logic state transition of said control signal, and wherein said second predetermined delay determines an operating pulse width of said clear pulse; and at least one quiescent state control transistor coupled between said control gate and said first storage node, wherein said at least one quiescent state control transistor turns on during said operating pulse width of said clear pulse, thereby setting said first storage node at the same logic level as said second storage node.

16. The flip-flop as in claim 15, wherein said second delay network comprises an odd number of inverting gates.

17. A method of qualifying an output of a data flip-flop in a dynamic circuit, wherein said output is applied to a precharged node under controlled timing, said method comprising:

generating a control signal;

applying said control signal to a non-data input of said data flip-flop;

configuring said data flip-flop to set said output to a predetermined quiescent state in response to said control signal; and wherein said generating said control signal is accomplished by coupling a dummy flip-flop to said non-data input of said data flip-flop, and wherein said coupling includes:

connecting said non-data input of said data flip-flop with a clear input node of said dummy flip-flop;

holding a data input node of said dummy flip-flop to a predetermined voltage level;

coupling an output node of said dummy flip-flop to said non-data input of said data flip-flop and said clear input node of said dummy flip-flop through a delay network, wherein said delay network is configured to provide a predetermined delay to an output signal at said output node of said dummy flip-flop before applying said output signal to said non-data input of said data flip-flop and said clear input node of said dummy flip-flop; and identically applying an external clock signal to said data flip-flop and said dummy flip-flop by connecting their clock input nodes together and applying said external clock signal thereto.

* * * * *